United States Patent
Chong et al.

(10) Patent No.: US 7,256,112 B2
(45) Date of Patent: Aug. 14, 2007

(54) LASER ACTIVATION OF IMPLANTED CONTACT PLUG FOR MEMORY BITLINE FABRICATION

(75) Inventors: Yung Fu Chong, Singapore (SG); Dong Kyun Sohn, Singapore (SG); Liang Choo Hsia, Singapore (SG)

(73) Assignee: Chartered Semiconductor Manufacturing, Ltd, Singapore (SG)

( * ) Notice: Subject to any disclaimer, the term of this patent is extended or adjusted under 35 U.S.C. 154(b) by 23 days.

(21) Appl. No.: 11/039,429

(22) Filed: Jan. 20, 2005

(65) Prior Publication Data

US 2006/0160343 A1   Jul. 20, 2006

(51) Int. Cl.
*H01L 21/42*   (2006.01)
(52) U.S. Cl. ....................... 438/593; 438/662
(58) Field of Classification Search .............. 438/597, 438/662
See application file for complete search history.

(56) References Cited

U.S. PATENT DOCUMENTS

| | | | |
|---|---|---|---|
| 4,181,538 A | | 1/1980 | Narayan et al. |
| 5,091,327 A | * | 2/1992 | Bergemont ................. 438/261 |
| 5,278,438 A | * | 1/1994 | Kim et al. .................. 257/316 |
| 5,349,221 A | * | 9/1994 | Shimoji ..................... 257/324 |
| 5,607,881 A | * | 3/1997 | Huang ........................ 438/238 |
| 5,940,726 A | * | 8/1999 | Yu ............................. 438/597 |
| 6,001,681 A | * | 12/1999 | Liu et al. .................... 438/238 |
| 6,110,845 A | | 8/2000 | Seguchi et al. |
| 6,197,624 B1 | * | 3/2001 | Yamazaki ................... 438/158 |
| 6,465,306 B1 | | 10/2002 | Ramsbey et al. |

(Continued)

OTHER PUBLICATIONS

Seong-Dong Kim, IEEE Transactions on Electron Devices, vol. 49, No. 10, Oct. 2002, "Advanced Source/Drain Engineering for Box-Shaped Ultrashallow Junction Formation Using Laser Annealing and Pre-Amorphization Implantation in Sub-100-nm SOI CMOS". http://www.ee.ucla.edu/faculty/papers/woo_TransED_oct02.pdf.

*Primary Examiner*—Andy Huynh
*Assistant Examiner*—David Goodwin
(74) *Attorney, Agent, or Firm*—William J. Stoffel

(57) ABSTRACT

An example method of forming a bitline contact region and bitline contact plug for a memory device using a laser irradiation activation process. An example embodiment comprises: providing a substrate having a logic region and a SONOS memory region. We form in the memory region, a memory transistor comprised of a memory gate dielectric, a memory gate electrode, memory LDD regions, memory spacers on the sidewalls of the memory gate electrode. We then perform a "memory Cell Source Line" implant to form a memory source line in the memory region adjacent to the memory gate electrode. We form silicide over the memory gate electrode and on the memory source line. We form an ILD dielectric layer over the substrate surface. We form a contact opening in the ILD dielectric layer over the memory Drain in the memory area. We etch an opening in the substrate in the drain region adjacent to the memory gate electrode. The opening exposes the memory cell first well and exposes the memory drain on the sidewall of the opening. We perform a bitline contact plug implant to from a doped contact region under the opening. We activate the doped contact region to form an activated doped contact region using a laser irradiation process. The laser irradiation process improves the electrical activation of the doped contact region without interfering with the silicide and S/D regions of the logic devices.

17 Claims, 3 Drawing Sheets

U.S. PATENT DOCUMENTS

| | | | |
|---|---|---|---|
| 6,472,328 B2 * | 10/2002 | Gilton et al. | 438/705 |
| 6,500,713 B1 | 12/2002 | Ramsbey et al. | |
| 6,721,146 B2 * | 4/2004 | Beach | 360/324.12 |
| 6,867,453 B2 * | 3/2005 | Shin et al. | 257/314 |
| 6,881,626 B2 * | 4/2005 | Lee et al. | 438/257 |
| 2004/0084716 A1 * | 5/2004 | Hung et al. | 257/316 |
| 2005/0130352 A1 * | 6/2005 | Maldei et al. | 438/128 |

* cited by examiner

LASER ACTIVATION OF IMPLANTED CONTACT PLUG FOR MEMORY BITLINE FABRICATION

BACKGROUND OF INVENTION

1) Field of the Invention

This invention relates generally to fabrication of semiconductor devices and more particularly to the fabrication of an implanted bitline contact plug.

2) Description of the Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

The state-of-the-art technologies for nonvolatile semiconductor memories are the SONOS (polysilicon-oxide-nitride-oxide-silicon) and the floating gate-type memories. The SONOS is a multi-gate dielectric device consisting of an oxide-nitride-oxide (ONO) layer in which charge storage takes place in discrete traps in the silicon nitride layer.

The importance of overcoming the various deficiencies noted above is evidenced by the extensive technological development directed to the subject, as documented by the relevant patent and technical literature. The closest and apparently more relevant technical developments in the patent literature can be gleaned by considering Seong-Dong Kim, IEEE TRANSACTIONS ON ELECTRON DEVICES, VOL. 49, NO. 10, Oct. 2002 Advanced Source/Drain Engineering for Box-Shaped Ultrashallow Junction Formation Using Laser Annealing and Pre-Amorphization Implantation in Sub-100-nm SOI CMOS. http://www.ee.ucla.edu/faculty/papers/woo TransED oct02.pdf U.S. Pat. No. 4,181,538 Narayan, et al. Jan. 1, 1980—shows a method for making defect-free zone by laser-annealing of doped silicon.

U.S. Pat. No. 6,465,306 Ramsbey, et al. Oct. 15, 2002—Simultaneous formation of charge storage and bitline to wordline isolation.

U.S. Pat. No. 6,500,713 Ramsbey et al.—shows a process for repairing damage to charge trapping dielectric layer from bit line implantation.

U.S. Pat. No. 6,110,845 Seguchi, et al. Aug. 29, 2000—Process for fabricating SOI substrate with high-efficiency recovery from damage due to Ion implantation.

SUMMARY OF THE INVENTION

The embodiments of the present invention provide a method of activating an implanted contact region in a substrate for a memory device.

An example embodiment for a method of fabrication of a bitline contact region for a memory device can comprise the steps of:

providing a substrate having a memory region;

providing in the logic region a logic transistor having silicide regions over logic S/D regions;

providing in said memory region, a memory transistor comprised of memory source regions and memory drain regions and a memory source silicide region over said memory source region;

forming an ILD dielectric layer over the substrate surface;

forming a bitline contact opening in said ILD dielectric layer over the memory drain in said memory area;

forming a recess in the substrate in the memory region and into the memory drain region;

performing a bitline contact region implant to from an unactivated contact region under said recess;

activating said unactivated bitline contact region to form an activated bitline contact region using a laser irradiation process.

The example embodiments can be used with memory devices in general and more particularly with SONOS memory devices.

Other embodiments are shown below and in the claims as finally issued.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

The example embodiments of the present invention aim to improve the electrical activation of the bitline contact doped region (in the substrate, for e.g., plug) by using laser irradiation to anneal/activate the contact plug after implantation. Besides being able to achieve high electrical activation (either by melt or non-melt laser anneal), one of the advantages of laser annealing is that it only affects the surface regions of the exposed semiconductor substrate. Hence, the logic devices and the silicided regions will not be affected drastically. In this way, transistor memory devices can be fabricated together with logic devices without any major changes in the conventional CMOS logic process flow.

A. Example Embodiment of Bit Line Doped Contact Region Process

The present invention will be described in detail with reference to the accompanying drawings. The present invention provides a method of forming a contact doped region in a substrate (e.g., plug) to a memory bitline.

B. Provide a Substrate Having a Logic Region and a Memory Region

Figure 1:
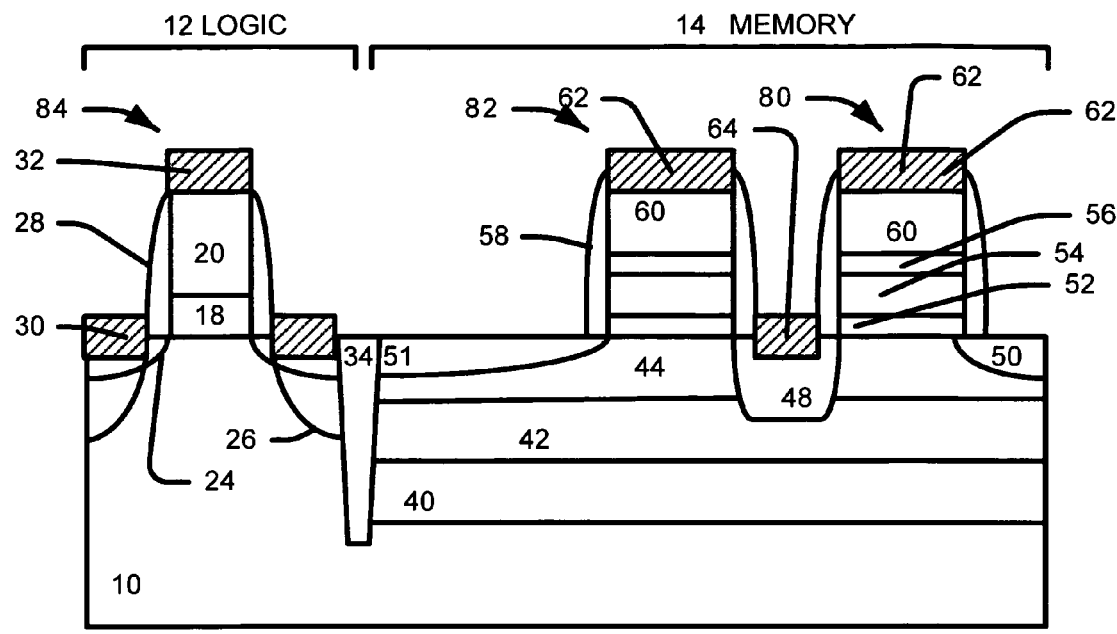
FIGS. 1 through 5 are cross sectional views for illustrating a method for manufacturing the bitline contact region in a memory cell according to an example embodiment of the present invention.

Referring to FIG. 1, we provide a substrate having a Logic region 12 and a memory region 14. A SONOS memory cell will be formed in the region 14. In the logic region 12, logic devices will be formed.

The substrate 10 is preferably comprised of crystalline silicon. A preferred substrate is a p-dope crystalline Si wafer with a (100) orientation. The substrate 10 can also be comprised of a crystalline silicon wafer of (110) orientation, a silicon on insulator substrate (SOI), strained silicon or SiGe (silicon-germanium).

C. Logic Region

We form in the logic region 12 a MOS transistor 84 comprised of a logic gate dielectric 18, a logic gate electrode 20, logic LDD regions 24, logic spacers 28 on the sidewalls of the logic gate electrode 20. The logic region 12 can further contain a well (not shown).

The MOS transistors in the logic region 12 can be both NMOS and PMOS, and can have both thin gate oxide and thick gate oxide (e.g., I/O) devices. In this example embodiment, a NMOS transistor is shown.

D. Memory Cell

We form in the memory (cell) region 14, preferably a memory transistor (such as a SONOS transistor) comprised of a memory gate dielectric 52 54 56, a memory gate electrode 60, memory drain regions 50 51, memory spacers 58 on the sidewalls of the memory gate electrode 60.

The memory drain regions 50 51 are formed simultaneously with the LDD regions 24 in the Logic region 12. The drain region 51 will be subsequently connected to a raised bitline by the bitline contact plug.

The memory gate dielectric stack (ONO) is preferably comprised of a lower oxide layer 52, a middle nitride layer 54 and an upper oxide layer 56.

The transistors in the memory cell can be both NMOS and PMOS. In this non-limiting example embodiment, a NMOS transistor is shown.

The SONOS memory region also preferably comprises a cell first well (e.g, Nwell) 42 and second well (e.g., Pwell) region 40. Region 44 preferably is comprised of the shallow Pwell & Vt Implants. The description below uses N and P type doping for the device, but the conductibility types can be either p or n.

Figure 2:
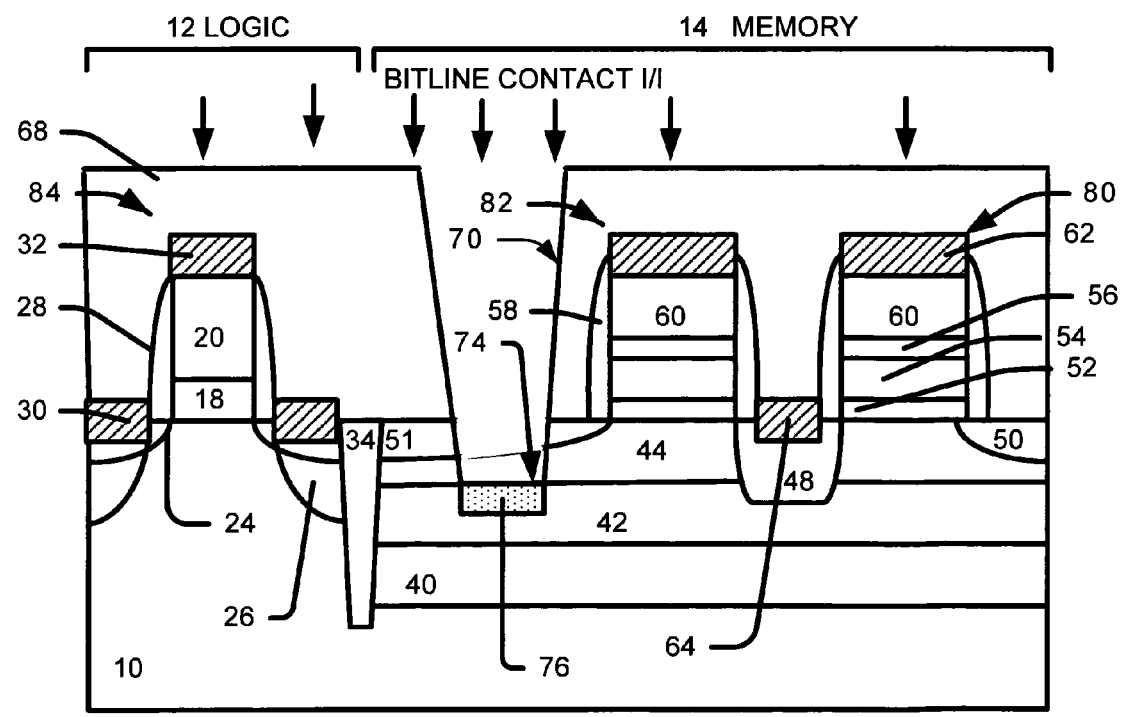

As shown in FIG. 2 the memory cell can comprise a first and a second memory transistors 80 (50 52 54 56 60 62 58 48) and 82 (51 52 54 56 60 62 58 48) that share a common cell source line (SL) 48.

Logic gate spacers 28 and Memory gate spacers 58 are formed on the gate sidewalls.

E. Perform a Logic S/D Implant

Still referring to FIG. 1, we perform a source and drain (S/D) implantation to form logic S/D regions 26 adjacent to the logic spacers 28 in the logic region 12.

F. Perform a "Memory Cell Source Line" Implant to Form a Memory Source Line 48

Still referring to FIG. 1, we perform a "memory Cell Source Line (SL)" implant to form a memory source line 48 in the memory region 14 adjacent to the memory spacers 58. During this cell SL implantation, the logic region 12 is covered with photoresist.

G. Annealing and Activating the S/D Regions

Next, we anneal the substrate to activate the impurities in the substrate such as the LDD and S/D regions in logic region 12, as well as the drain and cell SL region in memory region 14. Preferably we use an rapid thermal anneal (RTA) process with a temperature between 1000 and 1300 C for a time between 500 microsec and 5 sec. The RTA will cause the dopants to redistribute and become activated, for e.g., the cell SL 48 will diffuse to connect with the cell N well 42. Cell SL 48 will also diffuse laterally towards the memory gate electrode 60.

H. Forming Silicide

As shown in FIG. 1, we form silicide regions 30 32 62 64 (e.g., logic S/D silicide 30, memory source silicide 64, etc) over the logic gate electrode 20, the logic S/D regions 26, the memory gate electrode 60 and on the memory source line 48. Note that preferably no silicide is formed over the region where the contact doped region (plug) will be formed. This is easily achieved by using a silicide block hard mask such as oxide or nitride, which will be subsequently removed.

The silicide is preferably comprised of cobalt silicide, titanium silicide, nickel silicide, or nickel-platinum silicide and is most preferably cobalt silicide.

As shown in FIG. 2, we form an interlevel dielectric (ILD) layer 68 over the substrate surface. The ILD layer is preferably comprised of 3 layers; preferably comprising: (layer 1) a silicon nitride layer, (layer 2) undoped silicate glass (USG) layer and (layer 3) boro-phospho-silicate glass (BPSG) or phospho-silicate glass (PSG) layer. The ILD layer preferably has a total thickness between 3000 and 10000 Å.

I. Form a Contact Opening

We form a contact opening 70 in the ILD dielectric layer 68 over the memory drain 51 in the memory region 14 preferably using a mask and etch process. During this ILD etch, the logic region 12 is covered with photoresist.

J. Etch an Recess

Next, we etch an opening (Si recess) 74 in the substrate in the memory region 14 and preferably through the drain region 51 adjacent to the memory gate electrode 60. The opening 74 exposes the memory Nwell 42 and exposes the memory drain 51 on the sidewall of the opening.

The opening 74 preferably has a depth between 200 and 1200 angstroms.

The purpose of the opening 74 is to dope the exposed memory N well 42 thus forming the bitline contact plug upon subsequent activation.

K. Optional Preamorphizing Implant

In an optional step that is performed if the subsequent laser irradiation of the bitline contact 76 melts the crystalline Si, we perform a pre-amorphizing implant using Si+ or Ge+ to preamorphize the substrate prior to the bitline contact plug implant. This is because the melting temperature of amorphous silicon (a-Si) is ~250° C. lower than that for crystalline Si. Thus the process margin will be increased.

L. Perform a Bitline Contact Plug Implant to from a (Non-activated) Bitline Contact Region Under the Opening As shown in FIG. 2, we perform a bitline contact region (plug) implant to form a (non-activated) doped contact region 76 under the opening 74 in the substrate.

Preferably, for a P device, P-type ions such as B+ or $BF_2$+ are implanted into the contact opening to form the doped contact region 76. For example, the implant uses B or $BF_2$ ions implanted at an energy between 1 and 50 keV and at a dose between $1 \times 10^{14}/cm^2$ and $3 \times 10^{15}/cm^2$. The doped region has a depth beneath the contact opening between 5 and 50 nm.

Figure 3:
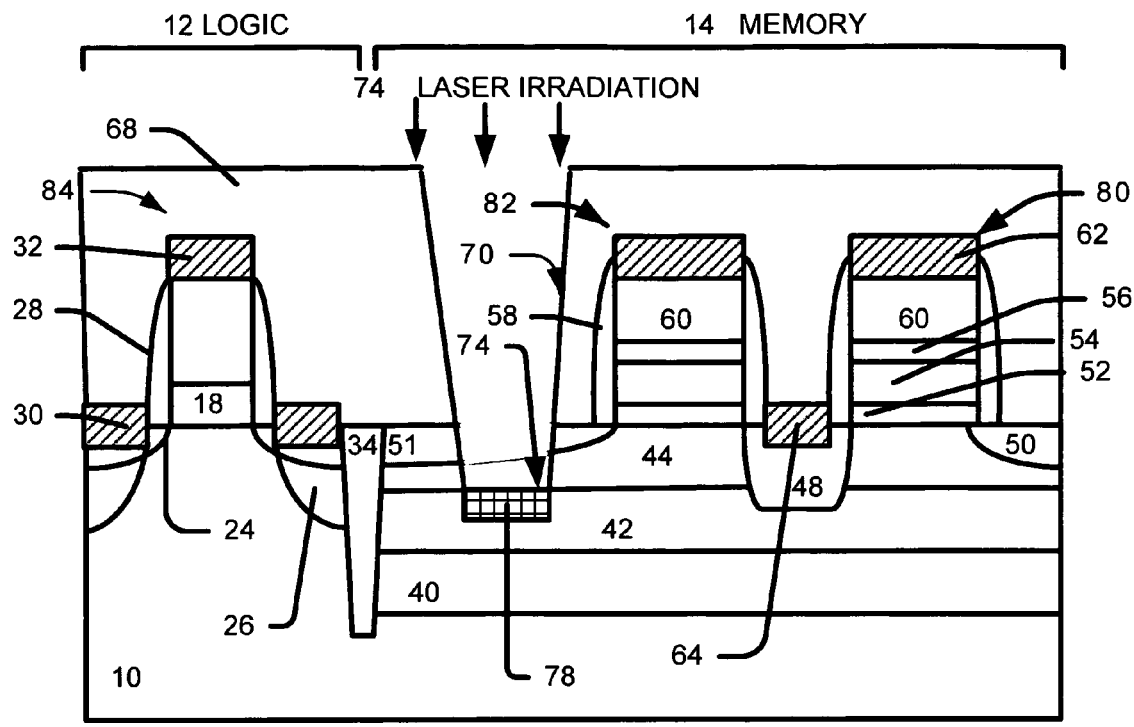

M. Activate the Doped Contact Region to Form an Activated Doped Contact Region Using a Laser Irradiation Process As shown in FIG. 3, we activate/anneal the doped contact region 76 using a laser irradiation process 74.

The laser irradiation process preferably comprises exposing the substrate to light of a selected wavelength at a desired fluence (energy or power density). The laser can be pulsed or continuous wave in nature. The wavelength of the laser irradiation is between 248 nm and 10.6 micron. The laser energy density can be in the range of 0.3 to 1.0 $J/cm^2$. The optical power density is in the range of 50 to 700 $kW/cm^2$. If melting occurs, the Si layer recrystallizes via liquid phase epitaxy from the underlying substrate.

One preferred feature of the laser anneal is that it is very short in duration, for e.g., the annealing time is in the range of 50 ns to 800 microsec. Hence the ramp up and ramp down rate of the laser anneal is much higher than the conventional RTA. Another preferred feature is that only the top surface region that is exposed to the laser is heated up. Therefore, the laser anneal will not have any significant adverse impact on the already formed silicided regions and the already activated S/D and LDD regions in the logic and memory region. To ensure that the already formed silicided regions and the already activated S/D and LDD regions are not excessively heated by the laser anneal, it is optional to have an anti-reflective layer coated on all areas except for the exposed bitline contact region 76. The anti-reflective layer can be part of the lithographic process when we mask to etch contact opening 70.

The purpose of the activated bitline contact region 78 is to reduce the contact resistance. The cell bitline contact region 78 is connected with the cell N well 42.

N. Form an Opening in the Logic Region

Figure 4:
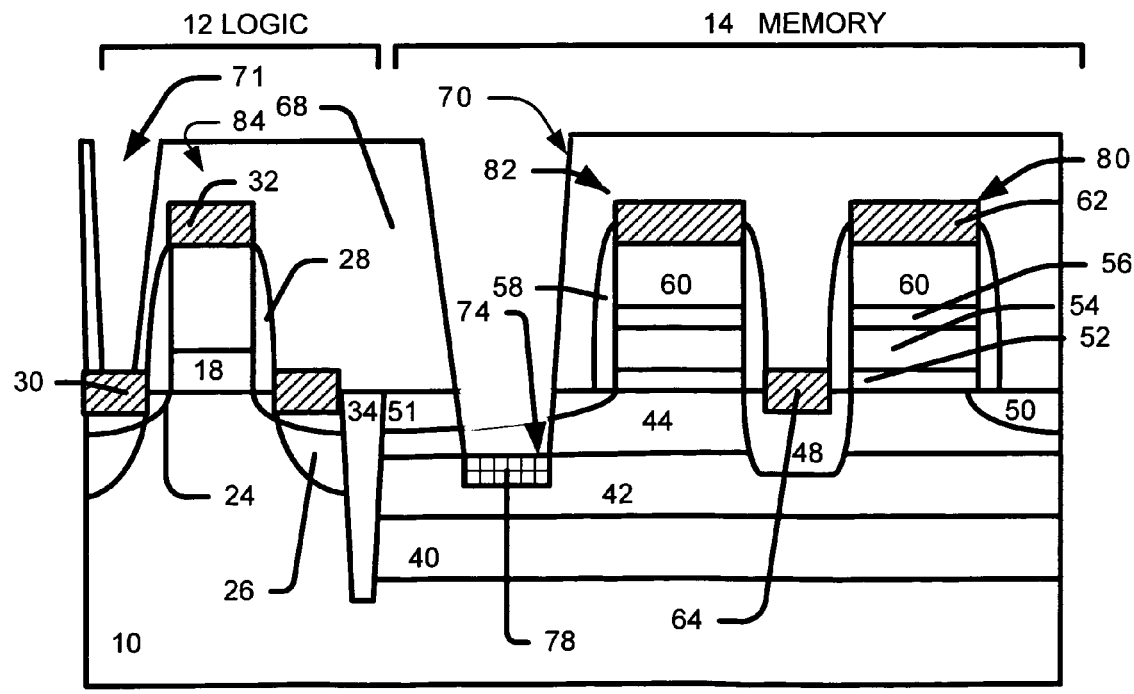

Next, referring to FIG. 4, we form a contact opening 71 in the ILD dielectric layer 68 over the logic S/D region 26 in the logic region 12 preferably using a mask and etch process.

O. Complete Logic and Memory Devices

Figure 5:
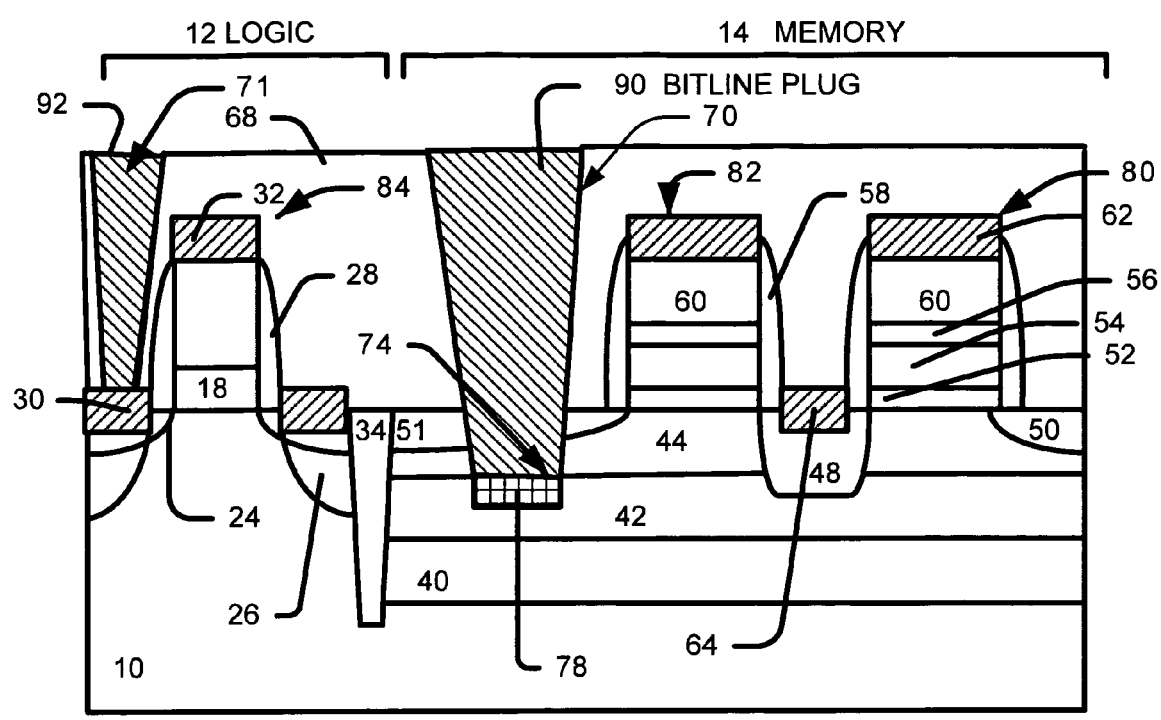

Next, we form conductive contact plugs to the devices. As shown in FIG. 5, for example, we form the conductive plug 92 over the logic S/D region and conductive plug 90 over the memory bitline region 78. Both the conductive/contact plug 90 and 92 can be formed by first depositing a thin barrier metal layer over the contact opening 70 and 71, followed by filling the openings with a conductive metal all the way to the substrate's surface. The conductive metal for filling the openings 70 and 71 is preferably tungsten (W). This is followed by a Chemical Mechanical Polishing (CMP) step to planarize the surface. Conventional processing is then done to complete both the logic and memory device.

P. Embodiment's Laser Irradiation

The embodiments of the present invention aims to provide a method to solve the problem of the poor electrical activation of the bitline contact plug, where the bitline contact etch and implant are performed after the silicidation process is done for the logic regions.

The embodiments are applicable to other types of memory that require the electrical activation of the bitline contact plug after the silicide is formed.

Q. Problems Example Embodiments Solve

The inventors have realized that one of the problems in fabricating SONOS-type nonvolatile transistor memory cell devices is the poor electrical activation of the bitline contact (plug) doped region if the bitline contact etch is performed after the silicidation process. The anneal temperature of the bitline contact plug cannot be too high else it will affect the silicide sheet resistance by causing agglomeration or converting the silicide to a high resistivity phase. The thermal budget is further constrained in order to minimize the impact to the logic devices because the Source/Drain activation anneal of the logic devices has already been conducted prior to the doping of the bitline contact region.

A reason the NOMOS memory is sensitive to the poor electrical activation of the bitline plug is because the bitline contact etch and implant are performed after the silicidation process is done for the logic regions. Hence, we cannot subject the wafer to a high temperature anneal or else the already formed silicide will degrade.

R. Non-limiting Example Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate different sized reactors as is known to those skilled in the art.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a bitline contact region for a memory device comprising the steps of:

providing a substrate having a logic region and a memory region;

providing in the logic region a logic transistor having silicide regions over logic S/D regions;

providing in said memory region, a memory transistor comprised of a memory source region and a memory drain region and a memory source silicide region over said memory source region;

forming an ILD dielectric layer over the substrate surface;

forming a bitline contact opening in said ILD dielectric layer over the memory drain region in said memory region;

forming a recess in the substrate in the memory region and into the memory drain region;

performing a bitline contact region implant to form an unactivated bitline contact region under said recess;

activating said unactivated bitline contact region to form an activated bitline contact region using a laser irradiation process.

2. The method of claim 1 wherein the laser irradiation process comprises exposing the substrate to light of a wavelength between 248 nm and 10.6 micron; and a laser energy density between 0.3 and 1.0 J/cm$^2$; and an optical power density in the range of 50 to 700 kW/cm$^2$; and the laser irradiation is pulsed or continuous wave.

3. A method of fabrication of a bitline contact region for a memory device comprising the steps of:

providing a substrate having a logic region and a memory region;

providing in the logic region a logic transistor having silicide regions over logic S/D regions;

providing in said memory region, a memory transistor comprised of a memory source region and a memory drain region;

forming an ILD dielectric layer over the substrate surface;

forming a bitline contact opening in said ILD dielectric layer over the memory drain region in said memory region;

forming a recess in the substrate in the memory region and into the memory drain region;

performing a bitline contact region implant to form an unactivated bitline contact region under said recess;

activating said unactivated bitline contact region to form an activated bitline contact region using a laser irradiation process.

4. The method of claim 3 which further includes forming contact openings in the ILD dielectric layer over the logic S/D regions in the logic region; and forming conductive plugs in said contact openings.

5. The method of claim 3 wherein said memory transistor is a SONOS transistor.

6. The method of claim 3 wherein the laser irradiation process comprises exposing the substrate to light of a selected wavelength at a desired fluence with a wavelength of the laser irradiation between 248 nm and 10.6 micron; and a laser energy density between 0.3 and 1.0 J/cm$^2$; and an optical power density in the range of 50 to 700 kW/cm$^2$; and the laser irradiation is pulsed or continuous wave.

7. The method of claim 3 wherein the laser irradiation process annealing time is in the range of 50 ns to 800 microseconds.

8. The method of claim 3 which further includes:

a) forming in the logic region a logic transistor comprised of a logic gate dielectric, a logic gate electrode, logic LDD regions, logic spacers on the sidewalls of said logic gate electrode, b) forming in said memory region, a SONOS transistor comprised of a memory gate dielectric, a memory gate electrode, memory LDD regions, memory spacers on the sidewalls of said memory gate electrode; said memory gate dielectric is comprised of a lower oxide layer, a middle nitride layer and an upper oxide layer;

c) performing a S/D implant to implant ions to form logic LDD regions adjacent said logic gate electrode in said logic region and memory S/D regions in said memory region;

d) forming logic gate spacers and Memory gate spacers on the gate sidewalls;

e) forming the logic S/D regions adjacent said logic gate electrode in said logic region;

f) performing a memory Cell Source Line implant to form a memory source line in said memory region adjacent to said memory gate electrode;

g) annealing and activating the memory S/D regions and logic S/D regions;

h) forming silicide regions over said Logic gate electrode, said logic S/D regions, said memory gate electrode and on said memory source line.

9. A method of fabrication of a bitline contact region for a SONOS device comprising the steps of:

a) providing a substrate having a logic region and a memory region;

b) forming in the logic region a MOS transistor comprised of a logic gate dielectric, a logic gate electrode, logic LDD regions, logic spacers on the sidewalls of said logic gate electrode, logic LDD regions adjacent said logic gate electrode in said logic region;

logic gate spacers on the logic gate electrode sidewalls;

logic S/D regions adjacent said logic gate electrode in said logic region;

a memory source line in said memory region adjacent to said memory gate electrode;

c) forming in said memory region, a memory transistor comprised of a memory gate dielectric, a memory gate electrode, memory LDD regions, memory spacers on the sidewalls of said memory gate electrode; memory S/D regions in said memory region; memory gate spacers are formed on the memory gate electrode sidewalls; a memory well under said memory gate;

d) forming silicide regions over at least one of the following: said logic gate electrode, said logic S/D regions, said memory gate electrode and on said memory source line; but not over said memory S/D regions;

e) forming an ILD dielectric layer over the substrate surface;

f) forming a bitline contact opening in said ILD dielectric layer over the memory drain region in said memory region;

g) forming a recess in the substrate in the memory region and through the memory drain region adjacent to the memory gate electrode; said recess exposes the memory well and exposes the memory drain region on the sidewall of the recess;

h) performing a bitline contact region implant to form an unactivated bitline contact region under said recess;

i) annealing said unactivated bitline contact region to form an activated bitline contact region using a laser irradiation process.

10. The method of claim 9 which further includes forming contact openings in the ILD dielectric layer over the logic S/D regions in the logic region; and forming conductive plugs in said contact openings.

11. The method of claim 9 wherein said substrate is comprised of crystalline silicon.

12. The method of claim 9 wherein said memory gate dielectric is comprised of a lower oxide layer, a middle nitride layer and an upper oxide layer.

13. The method of claim 9 wherein said recess has a depth between 200 and 1200 angstroms.

14. The method of claim 9 which further includes prior to the bitline contact region implant;

performing a preamorphizing implant using Si or Ge to preamorphize exposed substrate in the recess.

15. The method of claim 9 wherein the bitline contact region implant comprises using B or BF$^2$ ions implanted at an energy between 1 and 50 keV and at a dose between $1\times10^{14}/cm^2$ and $3\times10^{15}/cm^2$; the unactivated bitline contact region has a depth beneath the substrate surface opening between 5 and 50 nm.

16. The method of claim 9 wherein the laser irradiation process comprises exposing the substrate to light of a selected wavelength at a desired fluence with a wavelength of the laser irradiation is between 248 nm and 10.6 micron; and laser energy density is between 0.3 and 1.0 $J/cm^2$; and the optical power density is in the range of 50 to 700 $kW/cm^2$; and the laser irradiation is pulsed or continuous wave.

17. The method of claim 9 wherein the laser irradiation process annealing time is in the range of 50 ns to 800 microseconds.

* * * * *